United States Patent [19]

Goodman

[11] 3,708,870

[45] Jan. 9, 1973

[54] METHOD OF MANUFACTURING SEMI-CONDUCTOR DEVICES

[75] Inventor: Dennis George Goodman, Birmingham, England

[73] Assignee: Joseph Lucas (Industries) Limited, Birmingham, England

[22] Filed: April 29, 1971

[21] Appl. No.: 138,661

[30] Foreign Application Priority Data

May 21, 1970 Great Britain....................24,550/70

[52] U.S. Cl. ......................29/580, 29/588, 264/139, 264/272

[51] Int. Cl. ..............................................B01j 17/00

[58] Field of Search ........29/580, 583, 588; 264/139, 264/272

[56] References Cited

UNITED STATES PATENTS

| | | | |
|---|---|---|---|
| 3,313,013 | 4/1967 | Last | 29/580 |
| 3,488,835 | 1/1970 | Becke et al. | 29/583 |
| 3,633,269 | 1/1972 | Bachmeier | 29/589 |

*Primary Examiner*—John F. Campbell
*Assistant Examiner*—W. Tupman
*Attorney*—Holman & Stern

[57] ABSTRACT

A method of manufacturing semi-conductor devices includes the steps of forming a wafer with at least one P-N zone and at least one N-N zone and with the wafer positioned on a support, dividing the wafer into a plurality of parts each of which is to constitute a device. Channels are defined between the devices and P-N junctions are exposed in the channels. A curable compound capable of protecting the P-N junctions is then poured into the channels, and the compound is cured so as to form a membrane adhering to the devices and interconnecting the devices to facilitate handling thereof. The adhesion of the membrane to the devices is arranged to be substantially greater than the cohesive properties of the membrane so that, in use, the devices can be separated from the membrane by peeling the membrane from the devices. Then after the devices have been separated from the membrane, a portion of the membrane adheres to the exposed parts of the P-N junctions of the devices to provide protection of the P-N junctions.

4 Claims, 7 Drawing Figures

Figures 1, 2, 3, 4, 5, 6, 7:
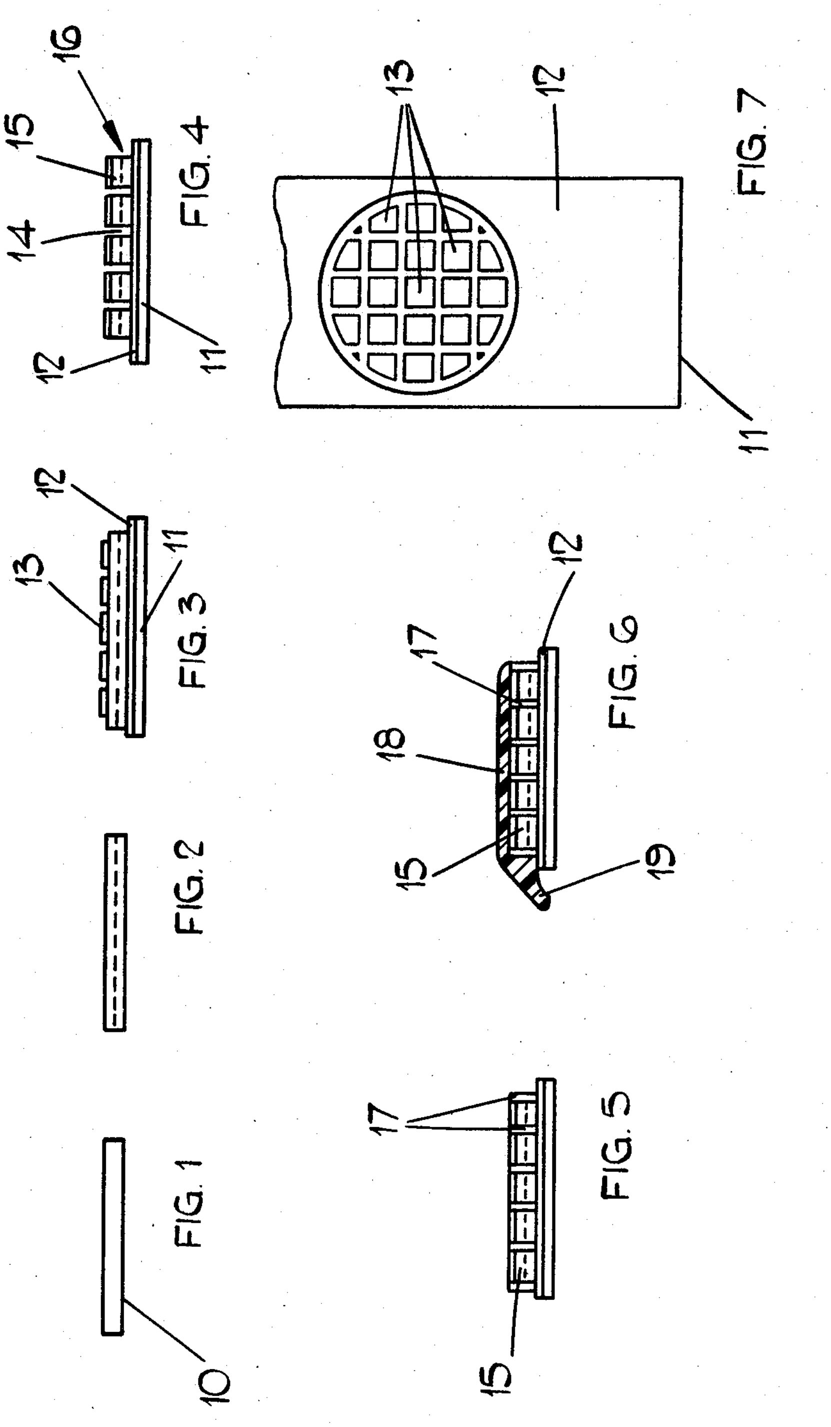

INVENTOR
Dennis George Goodman
ATTORNEYS

METHOD OF MANUFACTURING SEMI-CONDUCTOR DEVICES

This invention relates to a method of manufacturing semi-conductor devices.

A method of manufacturing semi-conductor devices, according to the invention, includes the following steps:

i. forming a wafer with at least one P-zone and at least one N-zone, ii. with the wafer positioned on a support, dividing the wafer into a plurality of parts each of which is to constitute a device, channels being defined between the devices and P-N junctions being exposed in the channels, iii. pouring into the channels a curable compound capable of protecting the P-N junctions, and iv. curing the compound so as to form a membrane adhering to the devices and interconnecting the devices to facilitate handling thereof, the adhesion of said membrane to the devices being arranged to be substantially greater than the cohesive properties of the membrane so that, in use, the devices can be separated from the membrane by peeling the membrane from the devices, a portion of the membrane adhering to the exposed parts of the P-N junctions of the devices after the devices have been separated from the membrane to provide protection of said P-N junctions.

Preferably, the method also includes the steps of providing a further curable compound on the membrane so as to cover the membrane, and curing said further compound so as to form a layer of material on the membrane adhering to the membrane, the adhesion of said layer of material to the membrane and the cohesive properties of the material being arranged to be substantially greater than the cohesive properties of the membrane, so that, in use, when said layer of material is peeled from the membrane said membrane is peeled from the devices to separate the devices from the membrane, whereafter portions of the membrane adhere to the exposed parts of the P-N junctions of the devices to provide protection of said junctions.

The invention further resides in a semi-conductor device manufactured in accordance with the method described in the preceding paragraphs.

In the accompanying drawings.

FIGS. 1 to 6 are sectional views illustrating five stages during the manufacture of diodes according to one example of the invention, and FIG. 7 is a plan view of FIG. 3.

Referring to the drawings, a silicon wafer 10 of P- or N- type material is treated by known diffusion techniques to form a P-N junction, (FIG. 2). After the P-N junctions have been formed, suitable metal layers (not shown) are plated onto the surfaces of the wafer to facilitate the making of subsequent electrical connections to the diodes to be produced. The wafer containing the P-N junctions is then secured to a glass or ceramic slide 11 by means of a thin layer 12 of wax. A steel mask (not shown) containing a plurality of rectangular holes is placed in position on top of the wafer, and a wax solution is sprayed onto the mask. The wax enters the apertures in the mask and adheres to the wafer so that when the mask is removed, the surface of the wafer includes a plurality of rectangular areas 13 which are coated with wax (FIG. 3). The slide carrying the wafer is then immersed in an etchant which removes the regions of the wafer between the masked areas 13 (FIG. 4).

It will be appreciated that the wax which is used to secure the disc to the slide, and the wax masking the areas 13 of the wafer is so chosen that it is unaffected by the etchant. When the exposed areas of the wafer have been etched away the slide 11 is removed from the etchant and is washed and dried. At this stage the slide carries a plurality of small rectangular P-N diodes 15 which are separated from one another by channels 14 and which are coated on both faces with wax, only the etched edges 16 of the diodes 15 being exposed. Etchant resistant materials other than waxes can of course be used.

A silicone elastomer which cures at room temperature and which comprises a mixture of an alpha, omega-dihydroxy-polydimethylsiloxane, a polydimethylsiloxane, an acetoxysilane, and a silica filler is poured, in liquid form, onto the slide 11 and is caused to flow into the channels 14 between the diodes (FIG. 5). When the channels 14 are filled with liquid elastomer the surface of the etched wafer is wiped to remove excess elastomer, leaving a network 17 of liquid elastomer in the channels 14. The liquid elastomer is then allowed to cure at room temperature to form a rubber membrane 17 interconnecting the diodes on the slide, the arrangement being such that the adhesion of the membrane to the diodes 15 is greater than the cohesive properties, and hence the tear strength, of the membrane. Thus when in use it is required to separate the diodes 15 from the membrane 17 the membrane can be peeled from the diodes which causes the membrane 17 to tear rather than the adhesion between the membrane and the diodes being broken. Thus the separated diodes, which at this stage are still secured to the slide 11, retain a coating of the cured elastomer round the edges of the diodes which protects the portions of the P-N junctions exposed on the edges of the diodes.

Preferably, to facilitate separation of the diodes 15 from the membrane 17 a coating of a further curable compound is applied to the membrane 17 to cover the membrane and is then allowed to cure so as to form a layer of rubber material 18 adhering to the membrane (FIG. 6). Any conventional rubber solution can be used as this further curable compound provided that the adhesion of the rubber material, on curing, to the membrane and the tear strength of the rubber material is greater than the tear strength of the membrane. Thus when in use it is required to separate the diodes 15 from the membrane 17 the rubber material is peeled from the membrane 17 and hence the membrane 17 is peeled from the diodes which, as before, causes the membrane 17 to tear rather than the adhesion between the membrane and the diodes being broken. Further it is preferable when applying the coating of said further curable compound to the membrane 17 that the coating should extend over at least one edge of the membrane 17 so that when the compound is cured the layer of rubber material 18 defines a tongue 19 projecting from the edge of the membrane, and preferably from the edge of the slide. The tongue 19 is gripped, in use, when it is required to remove the rubber material 18 from the membrane 17.

When the diodes 15 have been separated from the membrane 17 the diodes still remain secured to the slide 11, so that, after separation, the slide 11 is placed in a bath of liquid in which the wax covering the diodes and securing the diodes to the slide is soluble. Thus the wax is dissolved to leave individual diodes 15 having both faces thereof clean and the P-N junctions exposed at the edges of the diodes protected by the portions of the membrane 17 adhering thereto. As will be appreciated the solvent for the wax is arranged to be unreactive to the material of the membrane 17.

In one example a silicone elastomer as sold by I.C.I. under the trade name EP 6283 was used to form the membrane 17. This elastomer comprised a mixture as defined above and provided the required cohesive and adhesive properties in the membrane 17, the properties of the membrane comprising:

| | |
|---|---|
| Hardness | 27° B.S. |
| Tensile strength 215 foot pounds/square inch | |
| Elongation at break | 350% |
| Tear strength | 1.4 pounds. |

It is, of course, to be appreciated that other curable compounds than the silicone elastomer defined can be used to form the membrane 17, provided that, on curing, they exhibit the required cohesive and adhesive properties.

I claim:

1. A method of manufacturing semi-conductor devices including the following steps:

i. forming a wafer with at least one P-zone and at least one N-zone, ii. with the wafer positioned on a support , dividing the wafer into a plurality of parts each of which is to constitute a device, channels being defined between the devices and P-N junctions being exposed in the channels, iii. pouring into the channels a curable compound capable of protecting the P-N junctions, iv. curing the compound so as to form a membrane adhering to the devices and interconnecting the devices to facilitate handling thereof, the adhesion of said membrane to the devices being arranged to be substantially greater than the cohesive properties of the membrane so that, in use, the devices can be separated from the membrane by peeling the membrane from the devices, a portion of the membrane adhering to the exposed parts of the P-N junctions of the devices after the devices have been separated from the membrane to provide protection of said P-N junctions.

2. A method as claimed in claim 1 wherein said curable compound is a silicone elastomer.

3. A method as claimed in claim 1 including the further steps of providing a further curable compound on the membrane so as to cover the membrane, and curing said further compound so as to form a layer of material on the membrane adhering to the membrane, the adhesion of said layer of material to the membrane and the cohesive properties of the material being arranged to be substantially greater than the cohesive properties of the membrane, so that, in use, when said layer of material is peeled from the membrane said membrane is peeled from the devices to separate the devices from the membrane, whereafter portions of the membrane adhere to the exposed parts of the P-N junctions of the devices to provide protection of said junctions.

4. A method as claimed in claim 3 wherein said further curable compound is applied to the membrane so as to define, on curing, a tongue integral with said layer of material covering the membrane, the tongue projecting from the membrane and being gripped, in use, when it is required to remove said layer of material from the membrane and thereby separate the devices from the membrane.

* * * * *